United States Patent [19]
Heimlicher

[11] Patent Number: 6,130,489
[45] Date of Patent: Oct. 10, 2000

[54] INDUCTIVE PROXIMITY SWITCH

[75] Inventor: Peter Heimlicher, Freiburg, Switzerland

[73] Assignee: Optosys SA, Givisiez, Switzerland

[21] Appl. No.: 09/244,100

[22] Filed: Feb. 4, 1999

[30] Foreign Application Priority Data

Feb. 17, 1998 [EP] European Pat. Off. .............. 98810127

[51] Int. Cl.[7] ......................... H01H 47/00; H01H 83/00; H02B 1/24; H03K 17/95; H02H 1/24
[52] U.S. Cl. ............................................. 307/125; 361/179
[58] Field of Search ................................... 307/116, 125; 361/139, 160, 179, 186, 187

[56] References Cited

U.S. PATENT DOCUMENTS

| | | | |
|---|---|---|---|
| 3,629,678 | 12/1971 | Tyler | 318/558 |
| 4,544,892 | 10/1985 | Kaufman et al. | 324/334 |
| 4,652,819 | 3/1987 | Kammerer | 324/207 |
| 4,757,213 | 7/1988 | Tigges et al. | 307/116 |
| 5,498,958 | 3/1996 | Tu et al. | 324/207.16 |

FOREIGN PATENT DOCUMENTS 0 492 029 A1   7/1992   European Pat. Off. .

OTHER PUBLICATIONS

Swiss Electrotechnical Association, Technische Norm des Sev; Vorlaufige Ausgabe, kompletter Text; Niederspannungsschaltgerate. Teil 5: Steuergerate und Schaltelemente. Hauptabschnitt 2: Naherungsschalter.

Diese Norm ist die deutsche Fassung EN 60947–5–2:1997 [IEC 60947–5–2:1992+A1:1994+A1:1995, modif.](No Month).
International Electrotechnical Commission; First Edition 1992–08; Appareillage a basse tension; Partie 5; Low–voltage switchgear and controlgear, Part 5 (No Month).

*Primary Examiner*—Josie Ballato
*Assistant Examiner*—Andre A. Henry
*Attorney, Agent, or Firm*—Foley & Lardner

[57] ABSTRACT

An inductive proximity switch includes a coil that is supplied with periodic transmitting current pulses. Signals which correspond to voltages induced in the coil after the end of a transmitting current pulse by the decaying current which previously flows in the detected body due to the voltage induced therein by the transmitting current pulse are then processed. The coil is supplied with transmitting current pulses whose direction alternates periodically. The current flow pattern is such that in the first half of a period of the current supplied to the coil, the transmitting current delivered to the coil flows in a first direction and substantially only during a first interval which is shorter than one half of the period of the transmitted pulses. The transmitted current subsequently decays during a time interval and is negligibly small during the remaining time of the first half of the period. In the second half of the period, the transmitting current delivered to the coil flows in a direction opposite to the first one and substantially only during a second interval which is shorter than one half of the period of the transmitted pulses. The transmitted current subsequently decays during a time interval, and is negligibly small during the remaining time of the second half of the period.

9 Claims, 4 Drawing Sheets

INDUCTIVE PROXIMITY SWITCH

FIELD OF THE INVENTION

The present invention relates to an inductive proximity switch. More particularly, it relates to an inductive proximity switch that includes:

a coil;

means for supplying the coil with periodic transmitting current pulses; and means for processing the signals which correspond to voltages induced after the end of a transmitting current pulse in the coil by the decaying current which previously flows in the detected body due to the voltage induced therein by the transmitting current pulse.

BACKGROUND OF THE INVENTION

The principle of an inductive proximity switch is disclosed in EP-A-0492029 B1. In that proximity switch a, coil 11 is supplied with periodic unipolar voltage pulses having a period T. The useful signal is obtained by a suitable electronic circuit which responds to the voltage induced after the end of a transmitting current pulse in coil 11 by the decaying current which previously flows in the detected body, which consists of an electrically conductive material, due to the voltage induced therein by the transmitting current pulse.

The proximity switch known from EP-A-0492029 B1 has the following drawbacks:

Interfering magnetic low-frequency stray fields superimpose on the useful signal a noise signal whose amplitude may be quite considerable, thereby impairing the switching behavior of the proximity switch.

Since the useful signal may contain a large proportion of interference signals, it is suitable to integrate it over a relatively short time window only, thereby allowing to detect the interference signal each time during a second short time window near the end of the period T. Consequently, the resulting useful signal is relatively weak. The choice of the appropriate position and duration of the mentioned time windows is not easy, and it requires a compromise at the expense of the efficiency of the sensor.

For the above reasons, the useful signal is only available for further processing during a relatively short part of its total duration, whereby the efficiency of the sensor is further reduced.

The unipolar nature of the transmitting pulses implies that in each period T, the next transmitting pulse can only start when the current generated by the voltage induced in the detected body has almost completely decayed. Otherwise, an accumulation of currents results in the detected body which impairs the quality of the received signal. The mentioned waiting time results in a low clock frequency, thereby reducing the switching frequency of the device (according to a pertinent product standard EN 60947-5-2, Art. 2.4.3 the switching frequency is given by the number of switching operations of a proximity switch within a predetermined time interval).

Due to the D.C. component of the received signal, the elimination of amplifier offset voltages requires a more complex and therefore more expensive signal processing circuit.

SUMMARY OF THE INVENTION

An aim of the invention is to provide an inductive proximity switch of the kind mentioned in the introduction which allows to eliminate the above-mentioned drawbacks.

According to the invention, this aim is attained by an inductive proximity switch wherein a coil is supplied with transmitting current pulses whose direction alternates periodically. The current flow pattern is such that in the first half of the period, the transmitting current delivered to the coil flows in a first direction and substantially only in a first interval. The first interval is shorter than one half of the period of the transmitted pulses. The transmitted current subsequently decays during a time interval, and is negligibly small during the remaining time of the first half of the period. In the second half of the period the transmitting current delivered to the coil by the supply means flows in a direction opposite to the first one and substantially only during a second interval which is shorter than one half of the period of the transmitted pulses. The transmitted current subsequently decays during a time interval, and is negligibly small during the remaining time of the second half of the period.

The inductive proximity switch according to the invention provides in particular the following advantages:

The interference of low-frequency magnetic stray fields can be almost completely eliminated. The signal/noise ratio and hence the reliability of the switching behavior of the proximity switch are therefore substantially increased.

The useful signal is detected during a single time window which furthermore comprises the major part of the duration of the useful signal. The quality of the signal available for further processing is thereby improved.

As it is not necessary to wait for a full decay of the useful signal, before starting transmission of the next transmitting pulse, the clock frequency and thus the useful switching frequency of the proximity switch can be increased.

The polarity of the transmitting current pulses changes at every pulse. A disturbing current accumulation in the detected body is thus prevented even with short periods T.

No compromise must be made in determining the appropriate position and duration of the above-mentioned time window. This allows to freely choose a time window which allows an optimum adjustment of the switching distance to different metals, e.g. to steel or aluminum.

The mentioned improved properties of the useful signal provide a considerable increase of the switching distance.

The amplifier circuit can be simplified and is therefore less expensive, because use of A.C. coupling and a suitable processing of the useful signal makes it possible to eliminate amplifier offset voltages with a less complex circuit.

BRIEF DESCRIPTION OF THE DRAWINGS

An exemplary embodiment of the invention is described hereinafter with reference to the accompanying FIGS. 1 to 4.

DETAILED DESCRIPTION OF THE INVENTION

Figure 1:
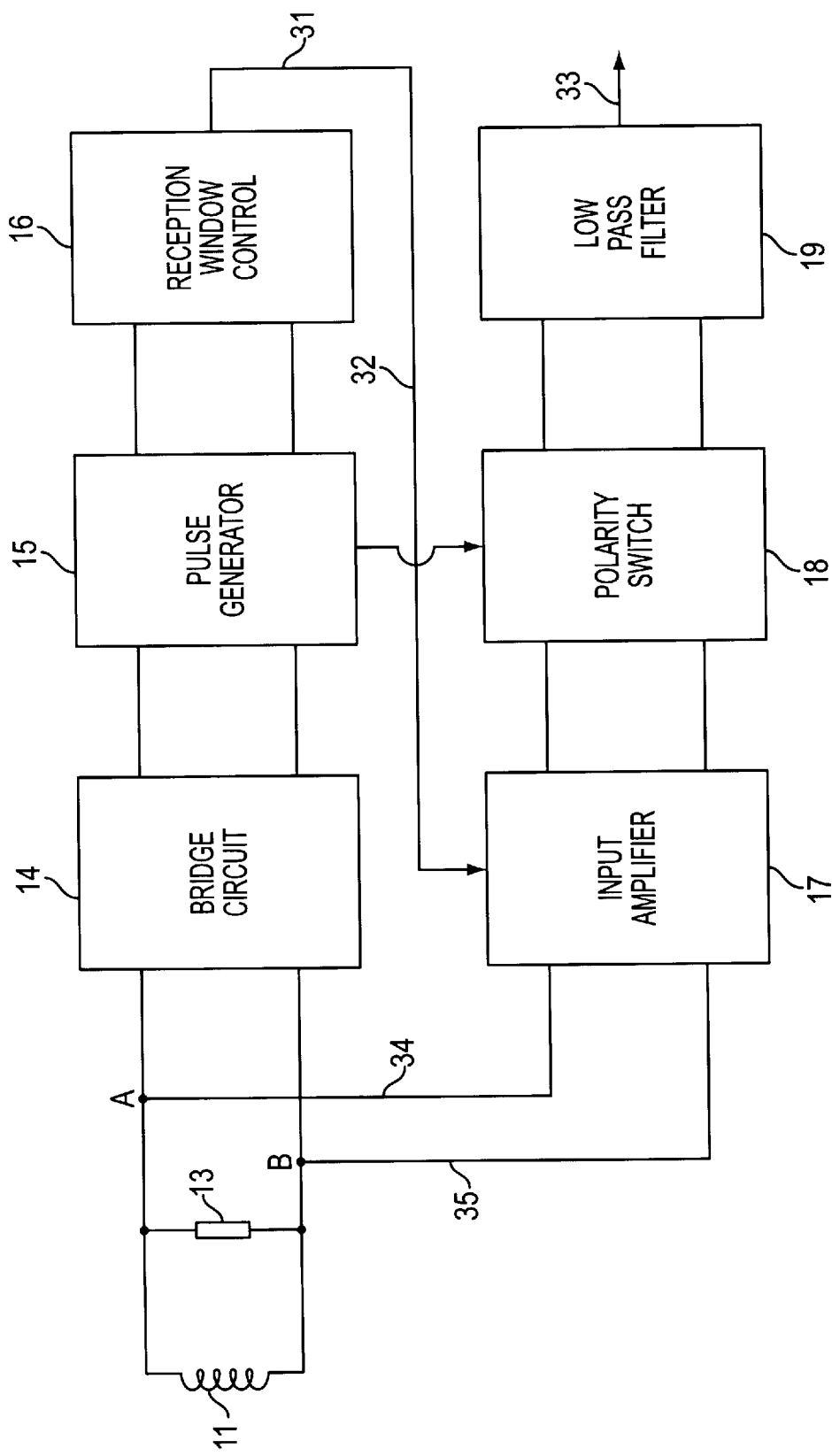
FIG. 1 shows a block diagram of the electronic circuitry of a proximity switch according to the invention.

As shown in FIG. 1 in a schematic manner, a proximity switch according to the invention comprises a coil 11 which is connected to a pulse generator 15 via a controlled bridge circuit 14. A resistor 13 is connected in parallel to the coil. This resistor serves as a damping resistor.

EXAMPLES OF SIGNALS WHICH BELONG TO THE OPERATION OF THE CIRCUIT SHOWN BY FIG. 1

Diagrams 2a and 2b of FIG. 2 show a preferred embodiment of the control signals p(t) and s(t) by means of which pulse generator 15 controls the function of bridge circuit 14. Control signal p(t) controls the polarity of the D.C. voltage applied to coil 11 by means of bridge circuit 14. Control signal s(t) is composed of periodical pulses with durations T11 and T13 respectively. The period of the control signal is T21.

Typically, the duration of T21 is 180 microseconds while that of T11 and T13 is 20 microseconds.

The control of bridge circuit 14 during a period T21 is described hereinafter with reference to FIGS. 2 and 3. At the beginning of T21, switches S1 and S4 are closed and switches S2 and S3 are opened by a polarity signal P11 (diagram 2a) supplied by pulse generator 15. Simultaneously, switch S0 is closed by a control pulse S11 (diagram 2b) during an interval T11. During the interval T11, bridge circuit 14 therefore connects terminals A, B of FIG. 3 to the terminals of a D.C. source V1 in such a manner that coil 11 is supplied with a D.C. voltage +V1.

Consequently, a current Ic11 (diagram 2c) flows through coil 11 during the interval T11.

At the end of T11, switch S0 is reopened by signal S11 during the interval T12, thereby disconnecting coil 11 from voltage source V1. The current Ic11 flowing in coil 11 drops to zero via Zener diode Z1 during the interval T11'. At the end of the interval T11' and until the end of the interval T12, point A remains connected to the negative pole of V1 by S4 while point B is connected to V1 neither by S1 nor by Z1 and is therefore only loaded by the high input impedance of amplifier 22 via a connection 35.

In the middle of T21, i.e. after the time T11+T12, switches S2 and S3 are closed while S1 and S4 are opened by the polarity signal P11 (diagram 2a) delivered by pulse generator 15. Simultaneously, switch S0 is closed by another control pulse S11 (diagram 2b) during an interval T13. During this interval T13, bridge circuit 14 therefore connects terminals A, B in FIG. 3 to the terminals of a D.C. voltage source V1 in such a manner the coil 11 is supplied with a D.C. voltage −V1.

Consequently, a current Ic12 (diagram 2c) flows through coil 11 during the interval T13.

At the end of T13, switch S0 is reopened by signal S11 during the interval T14, thereby disconnecting coil 11 from voltage source V1. The current Ic12 flowing in coil 11 drops to zero via Zener diode Z2 during the interval T13'. At the end of this interval T13' and until the end of the interval T14, point B remains connected to the negative pole of V1 by S3 while point A is connected to V1 neither by S2 nor by Z2 and is therefore only loaded by the high input impedance of amplifier 22 via a connection 34.

By repetition of the above-described process, coil 11 is alternatingly supplied with positive and negative current pulses.

As just described, in a proximity switch of the invention, the means for the supply of coil 11 with a periodical transmitting current are so designed that they supply coil 11 with periodical current pulses whose direction alternates periodically, the current flow pattern being such that:

in the first half of a period T21, the transmitting current delivered to the coil by the supply means flows in a first direction and substantially only during a first interval of the duration T11 which is shorter than ½*T21, said transmitted current subsequently decays during the time T11', and is negligibly small during the remaining time T12−T11' of the first half of the period T21, and in the second half of the period T21, the transmitting current delivered to the coil by the supply means flows in a direction opposite to the first one and substantially only during a second interval of the duration T13 which is shorter than ½*T21, said transmitted current subsequently decays during the time T13', and is negligibly small during the remaining time T14 of the first half of the period T21.

Figure 2A:
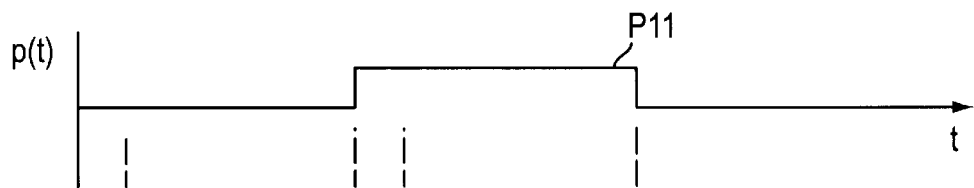
FIG. 2 shows diagrams of signals which are examples of signals which belong to the operation of a circuit according to FIG. 1.
Figure 2B:
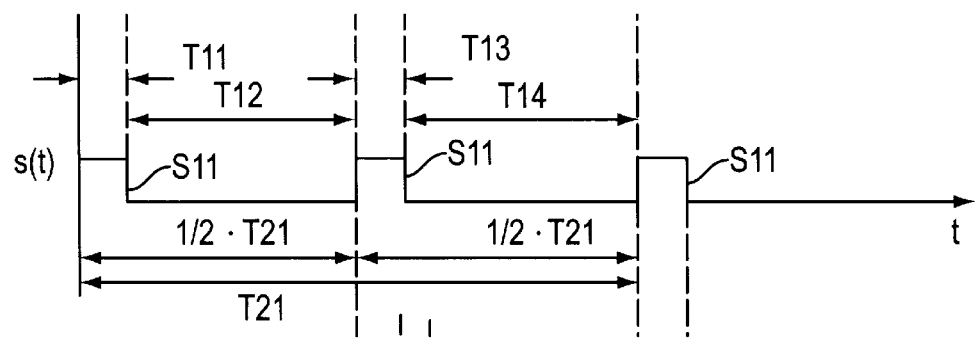
Figure 2C:
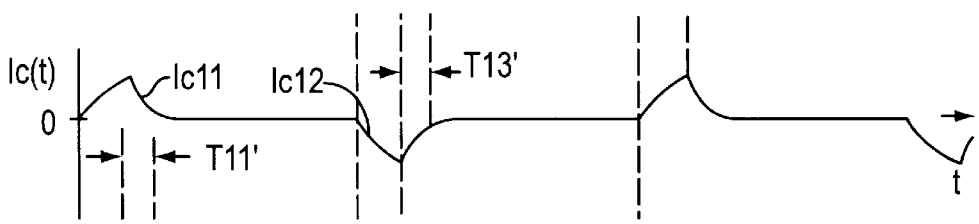
Figure 2D:
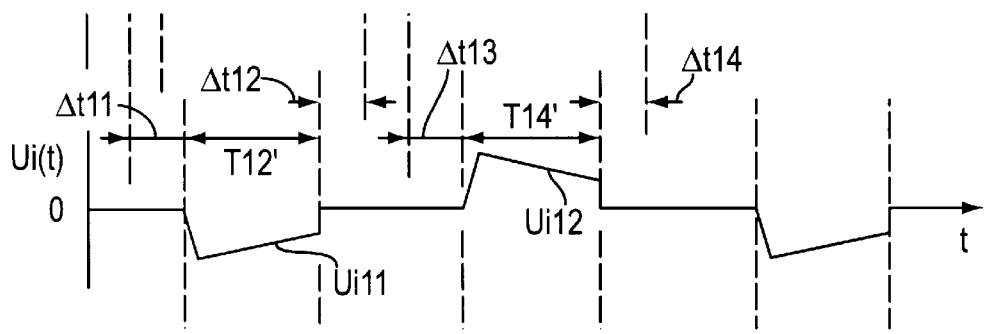
Figure 2E:
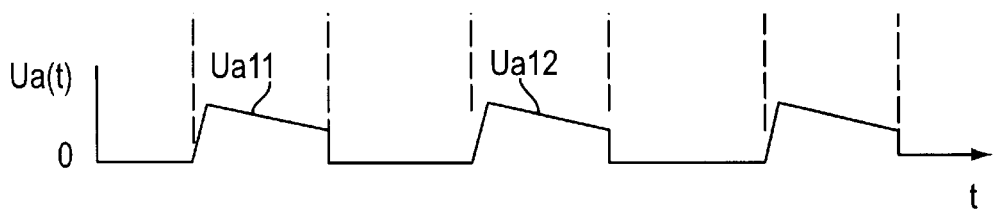

The intervals T11 respectively T13 are preferably substantially shorter than half the period T21, while it is advantageous to choose T11=T13, as shown in FIG. 2b.

The period T21 of the control signal p(t) according to diagram 2a of FIG. 2 and of the transmitting current pulses according to diagram 2c includes the four intervals T11, T12, T13, T14. T21 is equal to the sum T11+T12+T13+T14.

The above-described behavior of the current in coil 11 generates a variable magnetic field in the vicinity of coil 11. As appears in FIG. 4, coil 11 is aligned in such a manner that the mentioned field emerges through active surface 43 of the proximity switch.

When a detected body lies in the zone of influence of this variable magnetic field, voltages are induced in this body. Due to magnetic coupling, these voltages in turn produce induced voltages Ui in coil 11. These induced voltages are represented in diagram 2d of FIG. 2. The voltages generated in coil 11 by the transmitting current pulses are not represented here.

The negative induced voltage Ui11 is generated by currents in the detected body which originate from the positive transmitting current pulse Ic11 which flows through coil 11 during the interval of the duration T11.

The positive induced voltage Ui12 is generated by currents in the detected body which originate from the negative transmitting current pulse Ic12 which flows through coil 11 during the interval of the duration T13.

As can be appreciated from FIG. 2, with the signal waveforms shown there as examples it is possible to provide periodic transmitting current pulses so that each transmitting current pulse, e.g. Ic12, begins at a point of time at which there is only a partial decay of the useful signal Ui11 which is generated by the previous transmitting current pulse, e.g. Ic11. This means that each transmitting current pulse, e.g. Ic12, begins before there is full or practically full decay of the previous useful signal, e.g. Ui11. This makes possible to increase the clock frequency and thereby the switching frequency of the proximity switch substantially.

Figure 3:
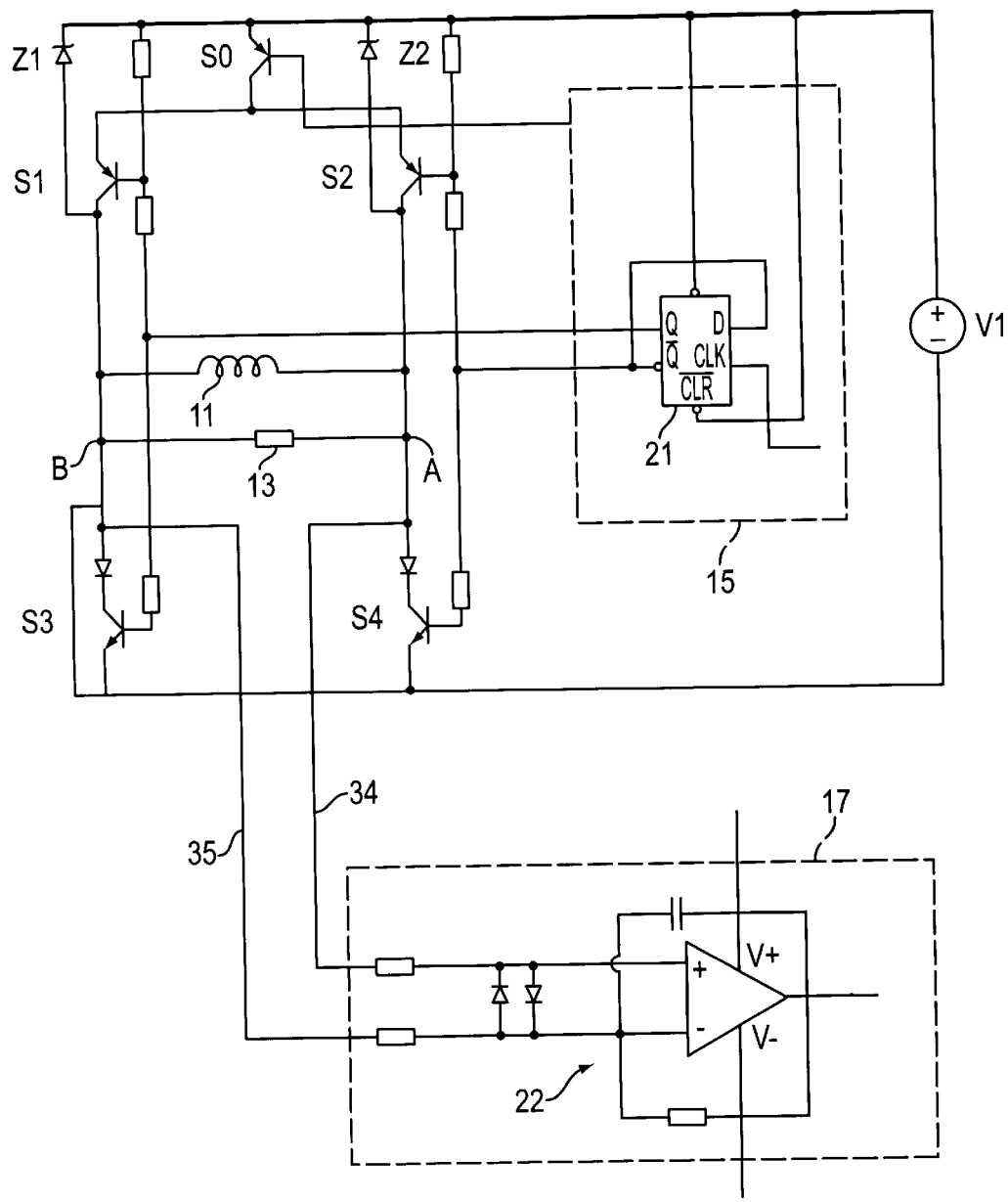
FIG. 3 shows the design of bridge circuit 14 in FIG. 1 in more detail, as well as elements of pulse generator 15 and input amplifier 17.

As described in more detail herebelow, the voltages Ui11, Ui12, etc. induced in coil 11, which are processed in units 17, 18, and 19 of FIG. 1 in order to obtain the useful signal, appear between terminals A and B in FIGS. 1 and 3. This useful signal may be subject to superimposed voltages which are induced in coil 11 by stray fields. Such interference signals are not shown in the illustration of the induced voltages Ui11, Ui12, etc. in diagram 2d of FIG. 2.

Terminals A and B are connected to the inputs of an input amplifier 17 by conductors 34 and 35. This amplifier is followed by a polarity switch 18 which, under control of the control signal p(t), either inverts the signal delivered to its input or not. This polarity switch is followed by a low-pass filter 19.

The voltages Ui11, Ui12, etc. shown in diagram 2d of FIG. 2 which are induced in coil 11 are supplied to input amplifier 17, where they are detected respectively processed as follows:

During a first time window T12', a first input signal in the form of induced voltage Ui11 is received by input amplifier 17 and amplified. Time window T12' begins after the end of the transmitting current pulse Ic11 and lies within the remaining time of the duration T12–T11' in the first half of period T21.

During a second time window T14', a second input signal in the form of induced voltage Ui12 is received by input amplifier 17 and amplified. Time window T14' begins after the end of transmitting current pulse Ic12 and lies within the remaining time of the duration T14–T13' in the second half of period T21.

The position in time and the duration of the first time window T12' and of the second time window T14' are controlled by a reception window control 16 shown in FIG. 1 via line 31. Reception window control 16 is in turn controlled by further control signals which are also delivered by pulse generator 15.

In a preferred embodiment, the first time window T12' begins after a delay of $\Delta t11$ from the beginning of interval T12. It ends simultaneously with T12, i.e. $\Delta t12=0$. The second time window T14' begins after a delay of $\Delta t13$ from the beginning of interval T14. It ends simultaneously with T14, i.e. $\Delta t14=0$. The first and the second time window preferably have approximately the same duration T12'=T14'.

Amplifier 17 comprises amplifier stages which due to the use of a bipolar signal waveform can be coupled with each other by means of A.C. coupling, which is not possible when unipolar signals are used. The A.C. coupling just mentioned has the advantage that the signal amplifier does not get saturated by amplifier offset voltage. The required amplification factor is typically 1000, amplifier offset voltage is typically 10 mV. With those values the amplifier offset voltage alone causes 10 V at the output. Without A.C. coupling amplifier 17 would be saturated already for an operating voltage of 7 V. When A.C. coupling is used, the D.C. amplification factor is only 1, that is the offset voltage which appears at the output is only 10 mV.

The amplified signals Ui11, Ui12, etc. delivered at the output of amplifier 17 are supplied to the input of polarity switch 18. The signals Ui11, Ui12 contain an additional interference signal in the form of the offset voltage of amplifier 17.

Polarity switch 18 is switched by periodical control pulses of the period ½* T21 in order to invert respectively not to invert input signals Ui11, Ui12, etc. during one of the corresponding time windows T12', T14', etc. In this manner, polarity switch 18 serves to transform the input signal in the form of a succession of pulses Ui11, Ui12, etc. into an output signal in the form of a succession of voltage pulses Ua1, Ua2, etc. of the same polarity.

The output signal of polarity switch 18 is smoothened by means of a low-pass filter 19, which acts as an averaging unit, in order to generate an output signal which signals the presence of a detected body. By the selective inversion of the negative useful signals such as e.g. Ui11 by polarity switch 18 and the following averaging and smoothing by means of low-pass filter 19, amplifier offset voltages and interference voltages induced in coil 11 by stray fields are periodically inverted and largely eliminated by the averaging and smoothing in low-pass filter 19. Therefore, at the output of the low-pass filter, a useful signal having a substantially improved signal/noise ratio is obtained. This allows a significant increase of the switching distance of the proximity switch.

BRIDGE CIRCUIT 14

FIG. 3 shows the design of bridge circuit 14 in FIG. 1 in more detail, as well as elements of pulse generator 15 and input amplifier 17. Controlled by output signals of pulse generator 15 and in particular by signals at the outputs of a flip-flop contained in pulse generator 15 (FIG. 3 only shows flip-flop 21 of pulse generator 15), transistor groups S0, S2, S3 on the one hand, and S0, S1, S4 on the other hand, are alternatingly switched through. As already described above with reference to FIG. 2, a D.C. voltage +V1 is thus applied to coil 11 during the interval T11 and a D.C. voltage −V1 is thus applied to coil 11 during the interval T13.

As shown in FIG. 3, the above-mentioned voltages Ui11, Ui12 (represented in diagram 2d of FIG. 2) induced in coil 11 are supplied to an input stage 22 of input amplifier 17 via conductors 34, 35 (FIG. 3 only shows input stage 22 of input amplifier 17).

PROXIMITY SWITCH ACCORDING TO FIG. 4

Figure 4:
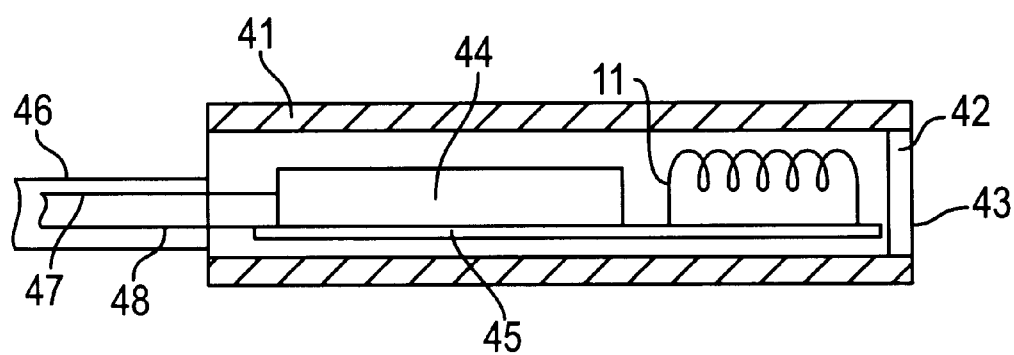
FIG. 4 shows a schematic cross-section of a proximity switch comprising the circuit of FIG. 1.

FIG. 4 shows a schematic cross-section of a proximity switch which comprises a circuit according to FIG. 1. As appears in FIG. 4, all components of the proximity switch are arranged in a housing which is essentially composed of a metallic cylinder 41 and of a cap 42 of a synthetic material. The cap seals the end of cylinder 41. The external surface 43 of cap 42 forms the active surface of the proximity switch which in operation faces the detected body.

In FIG. 4, block 44 represents all the components of the proximity switch illustrated in FIG. 1 except coil 11. Coil 11 and all components of block 44 are e.g. mounted on a printed circuit board 45. The block is connected by conductors 47 and 48 of a cable 46 to the device or system (not shown) where the signals obtained by the proximity switch are further processed.

What is claimed is:

1. An inductive proximity switch comprising:
   a coil;
   means for supplying the coil with periodic transmitting current pulses; and
   means for processing the signals which correspond to voltages induced after the end of a transmitting current pulse in said coil by the decaying current which previously flows in the detected body due to the voltage induced therein by the transmitting current pulse, wherein
   said supply means are adapted to supply said coil (11) with transmitting current pulses whose direction alternates periodically, the current flow pattern being such that
   in the first half of a period (T21), the transmitting current delivered to said coil (11) by said supply means flows in a first direction and substantially only during a first interval (T11) which is shorter than one half of the period (T21) of the transmitted pulses, said transmitted current subsequently decays during a time interval (T11'), and is negligibly small during the remaining time (T12–T11') of the first half of the period, and in the second half of the period (T21) the transmitting current delivered to said coil (11) by said supply means flows in a direction opposite to the first one and substantially only during a second interval (T13) which is shorter than one half of the period (T21) of the transmitted pulses, said transmitted current subsequently decays during a time interval (T13'), and is negligibly small during the remaining time (T14–T13') of the second half of the period.

2. An inductive proximity switch according to claim 1, wherein said first interval and said second interval of the transmitting current have a respective duration (T11 and T13, respectively) which is substantially shorter than a half of the period (T21) of the transmitting pulses.

3. An inductive proximity switch according to claim 1, wherein said first and said second interval (T11, T13) of the transmitting current have the same duration.

4. An inductive proximity switch according claim 1, wherein said signal processing means are adapted to receive during a first time window (T12') a first input signal in the form of a first voltage (Ui11) induced in said coil (11) which is generated by currents in the detected body which originate from the transmitting current flowing in the coil (11) during said first interval (T11), said first time window (T12') beginning after the interruption of said transmitting current and lying within said remaining time (T12–T11') of said first half of the period (T21) of the transmitting pulses, and to receive during a second time window (T14') a second input signal in the form of a second voltage (Ui2) induced in said coil (11) which is generated by currents in the detected body which originate from the transmitting current flowing in the coil (11) during said second interval (T13), said second time window beginning after the interruption of said transmitting current and lying within said remaining time (T14–T13') of said second half of the period.

5. An inductive proximity switch according to claim 4, wherein both said first time window (T12') and said second time window (T14') extend up to the end of half a period (T21).

6. An inductive proximity switch according to claim 4, wherein said first and said second time window (T12', T14') have the same or approximately the same duration.

7. An inductive proximity switch according to claim 4, wherein said signal processing means comprise a polarity switch (18) which is switched by periodical pulses having a period which is one half of the period (T21) of the transmitting pulses in order to selectively modify the polarity of signals corresponding to said first and second input signal respectively and thereby to generate an output signal (Ua11) which is comprised of a succession of voltage pulses of the same polarity.

8. An inductive proximity switch according to claim 7, wherein the output signal of said polarity switch is averaged and smoothened by means of a low-pass filter in order to generate an output signal which signals the presence of a detected body.

9. An inductive proximity switch according to claim 1, wherein each transmitting pulse (Ic12) begins at a point of time, at which there is only partial decay of a useful signal voltage (Ui11) induced in said coil (11), said voltage being related to the previous transmitting pulse (Ic11).

* * * * *